United States Patent [19]

Hogan et al.

[11] Patent Number: 5,415,337
[45] Date of Patent: May 16, 1995

[54] METHOD AND APPARATUS FOR APPLYING SOLDER FLUX TO A PRINTED CIRCUIT

[75] Inventors: Patrick T. Hogan, Lorain; Richard G. Christyson, Lakewood, both of Ohio

[73] Assignee: Nordson Corporation, Westlake, Ohio

[21] Appl. No.: 287,361

[22] Filed: Aug. 8, 1994

Related U.S. Application Data

[62] Division of Ser. No. 146,924, Nov. 4, 1993, Pat. No. 5,368,219.

[51] Int. Cl.$^6$ .................. B05B 15/00; B05B 15/02; B23K 1/20
[52] U.S. Cl. .................. 228/223; 228/102; 427/96
[58] Field of Search .......... 228/102, 207, 233; 427/96, 421; 118/324, 326

[56] References Cited

U.S. PATENT DOCUMENTS

| | | | |
|---|---|---|---|
| 2,028,355 | 1/1936 | Russi | 118/302 |
| 2,478,557 | 8/1949 | Bell et al. | 239/105 |
| 2,712,961 | 7/1955 | Richardson | 239/105 |
| 3,211,377 | 10/1965 | Brenner | 239/106 |
| 3,445,262 | 5/1969 | Greck et al. | 427/236 |
| 3,715,227 | 2/1973 | Alburger | 106/270 |
| 3,741,150 | 6/1973 | Napor et al. | 118/302 |
| 3,876,144 | 4/1975 | Madden et al. | 239/106 |
| 3,916,032 | 10/1975 | Conner | 427/8 |
| 3,952,951 | 4/1976 | Raetz et al. | 239/105 |
| 3,964,683 | 6/1976 | Gimple | 239/105 |
| 4,228,961 | 10/1980 | Itoh | 239/105 |
| 4,380,320 | 4/1983 | Hollstein et al. | 239/697 |
| 4,408,562 | 10/1983 | DeCamp et al. | 118/669 |
| 4,517,917 | 5/1985 | Santefort | 118/302 |
| 4,550,584 | 12/1985 | Henninger | 228/118 |
| 4,792,094 | 12/1988 | Tachi et al. | 239/106 |
| 4,811,898 | 3/1989 | Murphy | 239/706 |
| 4,814,794 | 3/1989 | Sato | 239/112 |
| 4,821,948 | 4/1989 | Fisher et al. | 228/223 |
| 4,828,887 | 5/1989 | Toutant et al. | 427/424 |
| 4,979,677 | 12/1990 | Dankert | 239/105 |
| 5,017,409 | 5/1991 | Bok | 427/424 |
| 5,056,720 | 10/1991 | Crum et al. | 239/698 |
| 5,065,692 | 11/1991 | Hollesen et al. | 118/323 |
| 5,296,035 | 3/1994 | Chicatelli et al. | 118/692 |
| 5,344,073 | 9/1994 | Waryu et al. | 118/302 |

FOREIGN PATENT DOCUMENTS

| | | | |
|---|---|---|---|
| 7942591 | 2/1992 | Australia . | |
| 0379339 | 1/1990 | European Pat. Off. . | |
| 2509851 | 9/1976 | Germany | 239/698 |
| WO90/05795 | 5/1990 | WIPO . | |
| WO93/16812 | 9/1993 | WIPO . | |

*Primary Examiner*—Samuel M. Heinrich
*Attorney, Agent, or Firm*—Howard M. Cohn

[57] ABSTRACT

Apparatus and methods for a system and process for applying a flux coating to a circuit board by pulsing an airless spray gun on and off to achieve excellent circuit board through-hole penetration and uniform film thickness. An overspray collection system is provided which reduces overspray and increases material utilization and transfer efficiency. A gun positioning mechanism, which can be automated, accurately locates the gun relative to the circuit board.

8 Claims, 3 Drawing Sheets

METHOD AND APPARATUS FOR APPLYING SOLDER FLUX TO A PRINTED CIRCUIT

This is a divisional of application Ser. No. 08/146,924 filed on Nov. 4, 1993, now U.S. Pat. No. 5,368,219.

FIELD OF THE INVENTION

This invention relates to the field of fabricating printed circuit boards and more particularly to an apparatus and method for applying soldering flux to the circuit boards with an airless spray gun prior to soldering leads of electrical components to the board.

BACKGROUND OF THE INVENTION

The production of circuit boards typically includes loading the boards onto a conveyor system and transferring them down a conveyor line where the leads of electrical components are inserted into the holes through the circuit board by a machine and/or manually. The boards are then transferred to an edge handling conveyor which transfers the boards through a flux station where solder flux is applied to the circuit boards so that the leads of the electrical components can later be soldered to the metallized areas of the board with a high quality solder bond. After the flux application station, the boards are transferred through a preheat zone to flash off the solvents from the flux and to preheat the board to minimize thermal shock from contact with solder wave. Continuing the process, the board is transported through a wave solder machine where the board moves over a wave of solder. The solder is drawn or forced up into through-holes containing the leads of the electrical components and solder bonds between the leads and the metallized sections of the board are formed. After leaving the wave solder machine, the board is sent through a cleaning machine to remove the residue left from the flux. The effectiveness of the flux application, the type of flux being applied, the need to clean the board subsequent to soldering, and the need to clean the coating chamber in which the solder flux is applied, each present problems which are addressed by the present invention.

Presently, three types of flux, i.e. rosin flux, organic acid flux, and low solids flux, are being used in the manufacture of circuit boards. Rosin flux and organic acid flux are the most prevalently used fluxes at this time. These two fluxes are normally applied by contacting the circuit board with either a liquid wave or a foam of flux, the latter being obtained by bubbling a gas through a flux which is made to foam. Alternatively, the flux can be applied to the circuit board by brushing or spraying. In both the liquid wave and foam application systems, an open vat or barrel containing the flux must be constantly monitored to keep the percent of solid to solvent within a range of predefined levels since solvents evaporate out of fluxes. The level of solvent content is determined by testing the specific gravity with an hydrometer. Whenever, the specific gravity moves out of the predefined range, a solvent, such as alcohol, is added to the open flux container to adjust the specific gravity as necessary. The amount of solvent needed to maintain the specific gravity in the required range and the constant monitoring requirement is a significant expense in the operation of the prior art systems.

While rosin-based fluxes dominate the electronic industry, there are serious problems associated with the use of these fluxes. Rosin-based fluxes often leave residues on the circuit board which detract from the quality of the board. For this reason, circuit boards using this type of flux must be cleaned after soldering. Moreover, since rosin residues are difficult to remove, harsh industrial detergents or chlorofluorocarbons must be used to clean the circuit board. The disposal of spent industrial detergents is usually expensive while the use of chlorofluorocarbons has been found detrimental to the environment. Because of these environmental concerns, chlorofluorocarbons are being phased out of use in the United States. They are becoming increasingly more expensive, as they are phased out. The cleaning equipment to apply the chlorofluorocarbons is required for each circuit board production line and is expensive to purchase, operate and provide the needed floor space.

The organic acid fluxes, on the other hand, can be effectively cleaned by water. However, water cleaning equipment is required for each circuit board production line and is expensive to purchase, operate and provide the needed floor space. The floor space requirement is of particular concern and expense because the length of the cleaning equipment.

In an effort to eliminate the need to clean the circuit boards after soldering, low-solid fluxes, or "no-clean fluxes", which contain small amounts, e.g., 1–5% by weight of solids (activator and vehicle) and the remainder liquid solvent, such as isopropyl alcohol, are being put increasingly more into use by circuit board manufacturers. Because of the small amount of solids within no-clean fluxes, the amount of residue left on the board is significantly reduced, as compared to the amount of residue remaining after the use of conventional rosin-based fluxes. These low-solid fluxes are particularly attractive because, as their name implies, cleaning of the circuit boards after soldering is not required, which is a tremendous cost savings. However, the application of the no-clean fluxes has been a problem. With the prior methods, i.e., using an open vat, the constant monitoring and control of the specific gravity has been difficult. Therefore, spraying no-clean fluxes with a closed system is the preferred method of application. The flux is stored in a closed container and delivered to a spray system with minimal prior exposure to air so that the solvents don't evaporate. The problem with the prior art spray systems is that they typically use a low pressure spray, which operates in the "air spray" fluid pressure ranges of 50 to 60 psi, and generates a lot of overspray within the coating chamber. This overspray wastes flux coating material and results in the chamber and the conveyor becoming covered with the flux coating material and being difficult and time-consuming to clean. Also, the overspray tends to clog up the control sensors which signal the location of the circuit board to the control system. This is detrimental because the spray is frequently turned on when the board is not in the proper location. This exacerbates the problem by generating even more overspray and creating an even greater mess which requires more frequent cleaning. Whenever the system is cleaned, the entire line must be shutdown, further increasing the overall manufacturing costs of the circuit boards. Another problem with the low pressure spray is that the flux does not always adequately penetrate the through-holes containing the leads to be soldered. This results in less effective solder connections between the leads of the components and the circuitry carried on the board.

These same poor through-hole penetration and excess overspray conditions also occur when the low pressure spray method is utilized with the other two types of solder fluxes as well.

Therefore, there is a need for a technique of applying solder fluxes, and particularly low-solid fluxes, to circuit boards so that overspray is minimized, and the overspray that is produced is effectively removed from the coating chamber to prevent it from collecting on the coating chamber, the conveyor, and the control sensors, while uniformly applying solder flux to the board and achieving excellent through-hole penetration.

OBJECTS AND SUMMARY OF THE INVENTION

It is an object of the present invention to provide a system and process for applying a flux coating to a circuit board which obviates the problems and limitations of the prior art systems.

It is a further object of the present invention to provide a system and process for applying a flux coating to a circuit board by which overspray is reduced and material utilization and transfer efficiency is increased.

Yet another object is to provide a system and process for applying a flux coating to a circuit board with an airless spray system to achieve excellent circuit board through-hole penetration.

Still another object is to provide a system and process for applying a flux coating to a circuit board by pulsing on and off an airless spray system to coat a section of the circuit board with a spray pattern whereby adjacent coated sections partially overlap each other to achieve excellent circuit board through-hole penetration and uniform film thickness.

In accordance with the invention, there is provided a system and method for applying a solder flux coating to a circuit board having through-holes between the uppersurface and the undersurface of the board. Leads of electrical components carried on the boards are inserted into the through-holes. A conveyor system transports the circuit board through a coating chamber. An airless spray gun, connected to a source of liquid solder flux, has a nozzle disposed within the coating chamber which emits a fan-shaped, liquid spray pattern from the nozzle. A control system is operatively connected to the spray gun for intermittently pulsing the gun on and off in response to movement of the circuit board through the coating chamber to coat a section of the undersurface of the circuit board with each pulse, whereby adjacent coated sections partially overlap each other so that each of the sections is sprayed two or more times from different angles to provide uniform coverage and effectively penetrate into the through-holes with the solder flux material.

According to the invention, the control means includes a controller connected to the gun for signalling the gun to initiate a pulse of coating material whenever the circuit board has travelled a first distance through the coating chamber from a point where the gun previously pulsed off, and to terminate the pulse whenever the circuit board has travelled a second distance through the coating chamber from the point where the pulse was initiated. The distance which the circuit board travels is sensed by an encoder which sends count signals to the controller corresponding to the distance of travel of the conveyor.

Further in accordance with the invention, the use of higher pressure pulsed airless spray technology minimizes overspray and an overspray collection system includes overspray collection ducts located between the airless spray gun and the undersurface of the circuit board on opposite sides of the spray pattern for collecting and oversprayed flux which is generated below the circuit board and a collection duct is provided to collect any overspray which migrates above the circuit board within the coating chamber.

The invention also has positioning means which are operatively connected to the spray gun for varying the distance between the nozzle of the gun and the undersurface of the circuit board so that outer edges of the spray pattern strike opposite edges of the board. The positioning means also aligns the nozzle of the spray gun with the centerline through the circuit board extending in the direction of travel.

BRIEF DESCRIPTION OF THE DRAWINGS

The structure, operation, and advantages of the presently preferred embodiment of the invention will become further apparent upon consideration of the following description taken in conjunction with the accompanying drawings, wherein.

DETAILED DESCRIPTION OF THE INVENTION

Figure 1:
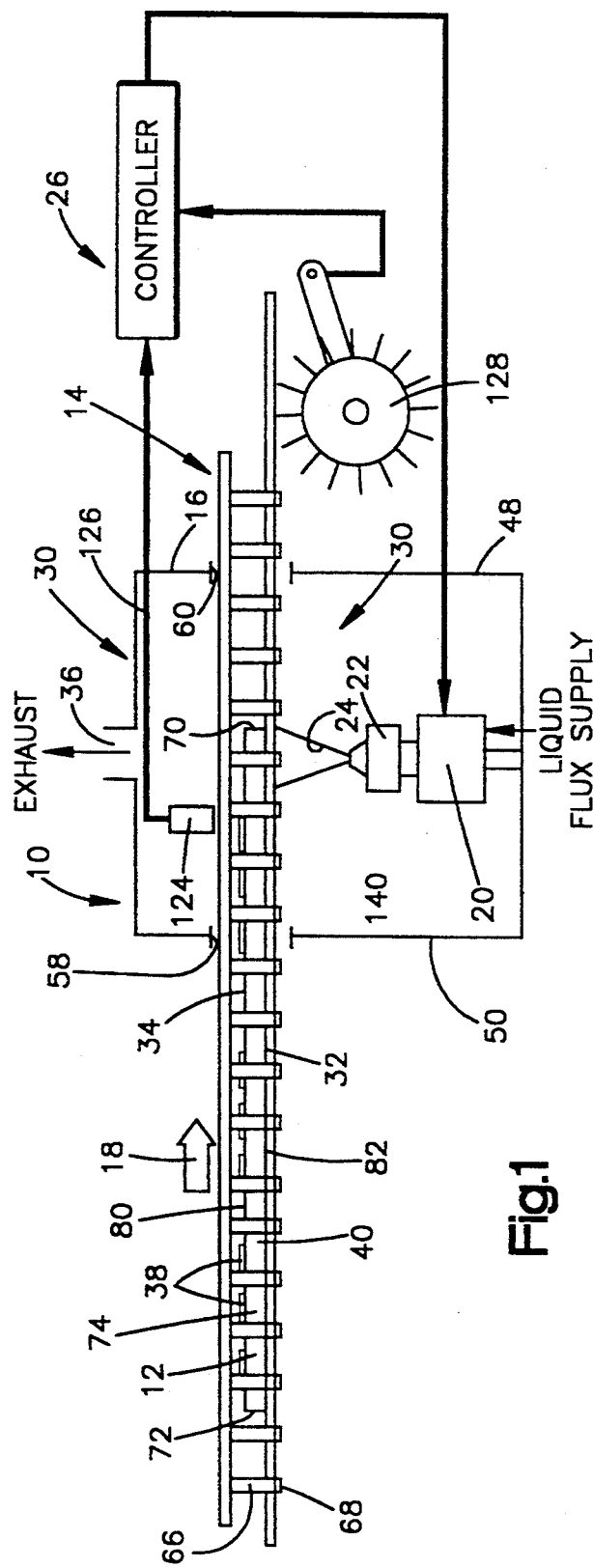
FIG. 1 is a side, elevational schematic illustration of a system for applying a flux coating with an airless spray gun onto a circuit board being transported by a conveyor through a coating chamber, in accordance with the invention.

Referring to FIG. 1, there is shown a schematic illustration of system 10 for applying a flux coating to a circuit board 12. System 10 includes a conveyor means 14 for transporting circuit board 12 through a flux coating chamber 16 in a direction of travel indicated by arrow 18. An airless spray gun 20 having a nozzle 22 is disposed within coating chamber 16 and emits an airless liquid spray pattern 24 from nozzle 22. Control means 26 is operatively connected to spray gun 20 for intermittently pulsing gun 20 on and off to coat overlapping sections of the undersurface of circuit board 12 in response to circuit board 12 moving a predetermined distance through the coating chamber. Overspray collection means 30, located within coating chamber 16, collects oversprayed flux from both below the undersurface 32 (see FIG. 2) and above the uppersurface 34 of circuit board 12 and exhausts it through a vent 36 from coating chamber 16.

Figure 2:
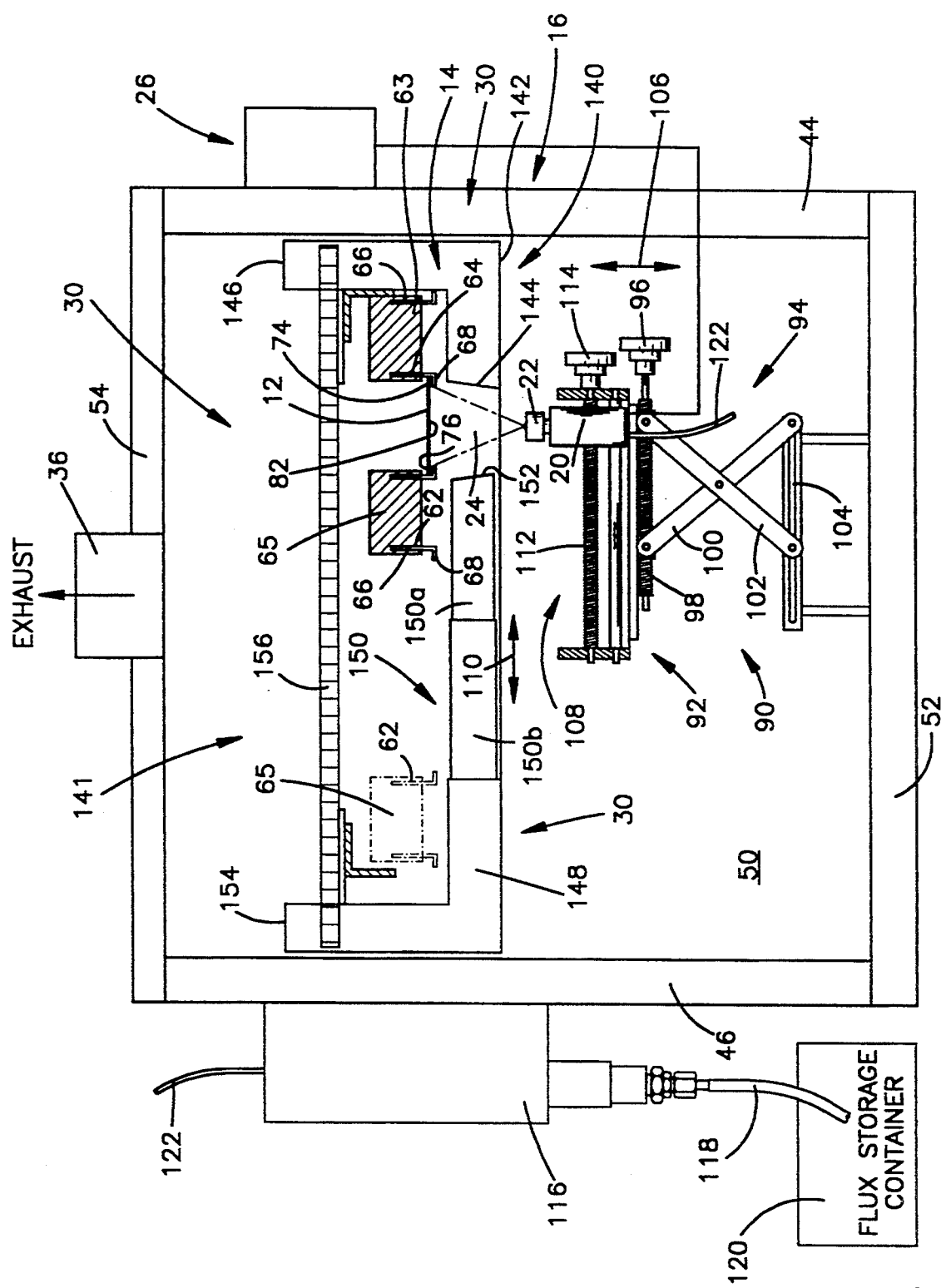
FIG. 2 is an end elevational view, partly in cross section, of a coating chamber housing a spray gun adjustably mounted with respect to the circuit board being transported by the conveyor, with overspray collection ducts located below the edges and above the uppersurface of the board.

As in the prior art, flux coating chamber 16 is located between an assembly station (not shown), where electronic components 38 are mounted on circuit board 14 with their leads 40 inserted into through-holes 78 extending through board 12, and a preheat station (not shown) directly downstream from coating chamber 16 where the board, already coated with a solder flux, is heated to flash off the solvents and elevate the board to a predetermined temperature which prevents damage from a high thermal gradient created when the board is passed through a conventional wave solder machine (not shown). The flux coating chamber 16, as shown in FIG. 2, is formed of two side walls 44, 46, a front wall 48, and a rear wall 50, each joined at their lateral edges and secured at their lower end to a base 52 and at their upper end to a ceiling 54. An exhaust vent 36 communicates with the interior of coating chamber 16 and serves to exhaust any overspray from within chamber 16 to a desired location.

The rear wall 50 and front wall 48 are each provided with an inlet opening 58, and an outlet opening 60, respectively, through which pass conveyor means 14. Conveyor means 14 includes coplanar conveyor chains 64 and 62 which travel along a fixed rail 63 and an adjustable rail 65, respectively. FIG. 2 shows the range of positions of adjustable rail 65 which enables system 10 to accommodate circuit boards of varied widths. Chains 62 and 64 each carry a plurality of equally spaced tabs 66. Each tab 66 has a finger 68 at its bottom which projects outwardly from the chain to which it is secured so as to point towards the fingers associated with the tabs carried by the other chain. Fingers 68 serve to engage opposite edges of circuit board 12, as seen in FIG. 2. The chains 62 and 64 are driven jointly, by a variable-speed electric motor (not shown). When chains 62 and 64 are driven in the direction indicated by the arrow 18, each circuit board 12 is carried through the flux coating chamber 16 and fluxed in the manner described hereinafter. After leaving flux chamber 16 through outlet opening 60, each circuit board 12 is transported through a preheat chamber (not shown) and then into a conventional wave-soldering machine (not shown) for soldering.

Figure 3C:
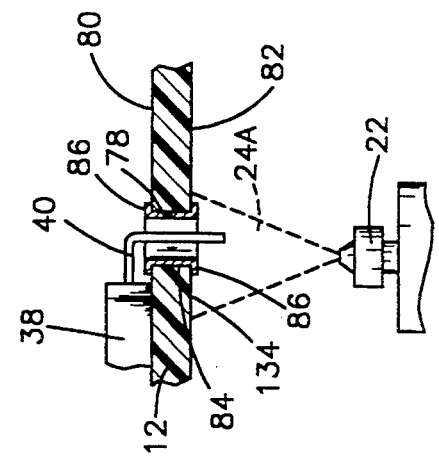
FIGS. 3A, 3B, and 3C show the position of the spray gun with respect to a through-hole in the circuit board, shown in cross section, having a lead wire inserted therein, at three consecutive on pulses to provide enhance coating and penetration of the flux into the through-hole.
Figure 3B:
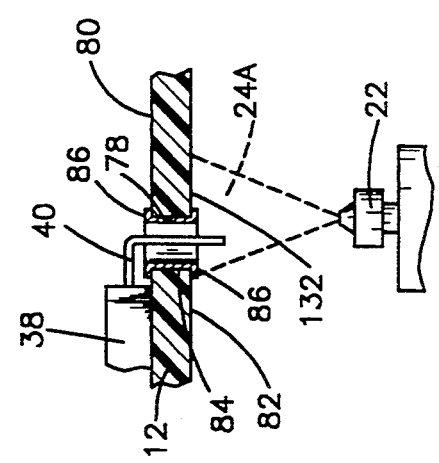
Figure 3A:
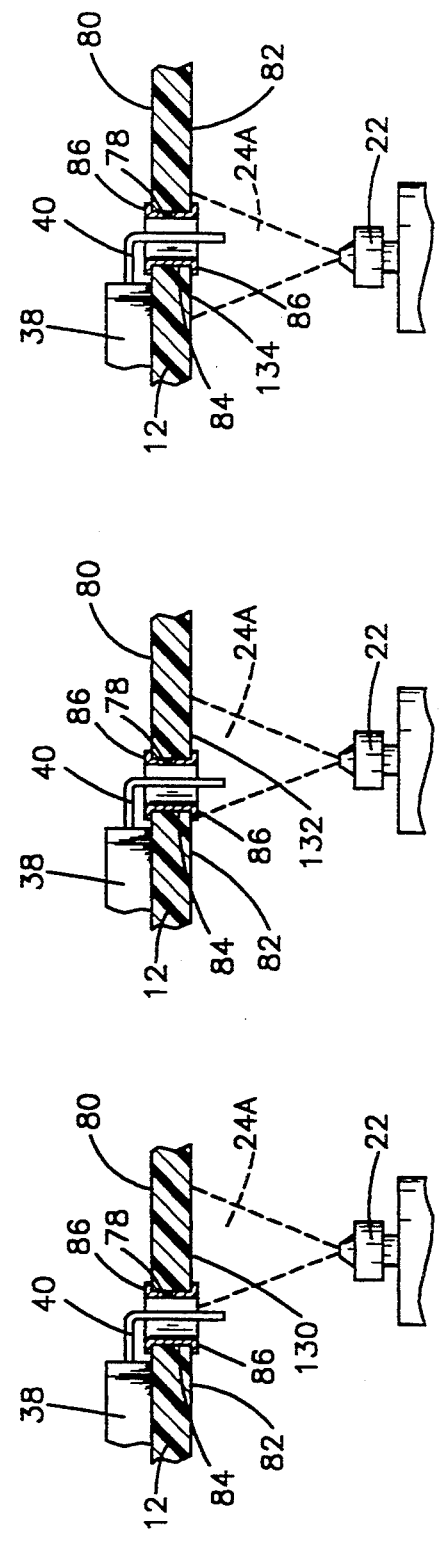

Referring now to FIGS. 1 and 2, a conventional circuit board 12 is comprised of a sheet of insulative material, i.e. epoxy resin, having front and rear ends 70 and 72, respectively, and opposite sides 74 and 76. A plurality of through-holes 78, as shown in FIGS. 3A,3B, and 3C, extend between the coplanar uppersurface 80 and undersurface 82 of board 12. Each through-hole 78 is plated with a layer of metal 84 which is joined to a pair of spaced metallized areas 86, located on the opposite surfaces 80 and 82. Metal paths (not shown) are provided on one or both of the surfaces 80 and 82 for selectively connecting the metallized areas 86.

Electronic components 38 are mounted on the upperside 80 of circuit board 12 by means of leads 40 passing through the through-holes 78. To assure a solid mechanical and electrical bond between each lead 40 and the metal layer 84 in each corresponding through-hole 78, the lead is soldered to metal layer 84. The soldering is preferably done in an automatic fashion, such as by passing the circuit board 12 over a wave of molten solder (not shown) so that the wave of solder contacts the undersurface 82 of the board and is drawn up into each through-hole 78 by wetting forces and thus bonds the lead 40 to the metal layer 84 as well as the metallized areas 86.

Prior to soldering, soldering flux is applied to the undersurface 82 of the circuit board so that during the subsequent soldering operation, the solder will wet the leads 40, the metal layer 84, the metallized areas 86. To assure a solid mechanical and electrical bond between the leads and the board, flux is sprayed into the through-holes after the leads are already in place. Therefore, it is an important feature of this invention to effectively coat the entire interior surface of through-hole 78 and lead 40 with flux.

A principle feature of this invention is the use of an airless spray gun 20 disposed within coating chamber 16 to apply the flux, which is preferably a low-solid, or no-clean flux. The spray gun 20 can be a Nordson Model A7A gun equipped with a Nordson Cross-Cut ® nozzle, manufactured by Nordson Corporation of Westlake, Ohio, the assignee of the present invention. Spray gun 20 uses a spray coating technique called airless atomization, as contrasted with the air spray atomization method, previously used in applying solder fluxes. With the air spray coating method, the liquid coating is atomized by air streams which impinge the liquid coating stream to atomize it as it as it exits the nozzle. Airless liquid spray coating, as used in the present invention, on the other hand, does not use an air stream to atomize the liquid, but hydrostatically pressurizes the liquid upstream of the nozzle orifice such that after it exits the nozzle orifice into the air at ambient pressure, the liquid stream expands and in the process is atomized by the hydraulic force alone. Another prior art method which has been employed is ultrasonic atomization, but this method also produces a low pressure mist of material like the air spray methods.

Spray gun 20 is mounted on a gun mounting fixture 90 which includes positioning means 92 to vary the distance and to center the gun nozzle 22 with respect to undersurface 82 of circuit board 12. Positioning means 92 includes a scissor device 94 for adjusting the vertical distance between gun nozzle 22 and the undersurface 82 of the board. The scissor device 94 can be easily adjusted by manually turning a hand wheel 96 connected to a threaded rod 98. As the rod 98 turns, the upper end of a cross arm 100 moves with respect to hand wheel 96 and causes the end of arm 102 to slide in a slot 104 since members 100 and 102 are pivotally connected at their centers. This results in spray gun 20 moving in the direction of arrow 106, towards and away from board 12. The nozzle is preferably positioned so that the top outer edges of spray pattern 24 impinge upon the opposite side edges 74 and 76 of circuit board 12. Positioning means 92 also includes a screw drive 108 for adjusting gun 20 in a direction transverse to the direction of travel 18, as indicated by arrow 110, so that the nozzle of gun 20 is centered with respect to board 12. Screw drive 108 includes a threaded rod 112 which can be manually turned by a hand wheel 114 to move gun 20.

FIG. 2 shows spray gun 20 being supplied with solder flux by a pump 116 which is a Nordson Model 25B pump, manufactured by Nordson Corp. of Westlake, Ohio, the assignee of the present invention. Pump 116 Siphons the solder flux material through a tube 118 from a drum 120 in which the solder flux material is originally supplied by the solder flux manufacturer. The solder flux passes through a filter (now shown) in route from the pump 115 through a delivery tube 122 to gun 20. By supplying gun 20 with flux coating liquid at a pressure in the range of 400–600 psi, nozzle 22 emits an airless fan shaped liquid spray pattern. It is also within the terms of the invention for the spray pattern to have other shapes, such as conical. Whereas the prior low pressure application devices have operated in the "air spray" fluid pressure ranges of 50 to 60 psi, in the present invention, where an "airless" application of the solder flux is utilized, the fluid pressure is in the range of about 400 to about 600 psi, as mentioned. The use of a high pressure in the fluid stream is an important aspect of the invention because of the reduction in overspray generated and improved penetration of the solder flux into through-holes 78.

Another aspect of the invention is that the solder flux is pulsed onto the undersurface 82 of board 12 instead of being sprayed as a steady stream. Pulsing a high pressure spray of solder flux ensures that the coating is uniformly applied across the undersurface 82 of the board without generating undue overspray. Pulsing in combination with a high pressure spray also ensures effective penetration of through-holes 78 because the flux impacts each hole 78 in board 12 from more than one angle, since the board is moving and the gun is fixed. As illustrated in FIG. 1, board 12 is transferred to the right in the direction of arrow 18. The movement of board 12 triggers a sensor 124 which is connected to controller 26. When the front end 70 of circuit board 12 passes under sensor 124, sensor 124 sends a signal through line 126 to a controller 26 indicating the position of the leading edge of circuit board 12 with respect to nozzle 22. Preferably, sensor 124 is positioned upstream from the location of the nozzle so that when board 12 is being sprayed, the circuit board shields sensor 124 and prevents it from being coated with overspray. Controller 26 also receives an electrical input from encoder 128 which sends an electrical pulse to controller 26 every time conveyor 14 (and board 12) moves a predetermined distance. Controller 26 accesses a pulsing program and in response to the signal from sensor 124 opens the valve (not shown) in spray gun 20 for a certain number of counts from encoder 128 to spray a pulse of coating onto the circuit board. Controller 26 then closes the gun valve for a certain number of counts from encoder 128, and then opens the valve for a certain number of counts from encoder 128 to spray another pulse. This continues for as long as the sensor 124 senses the presence of a board. Encoder 128 typically rotates with the movement of conveyor chains 62 and 64.

Figure 4:
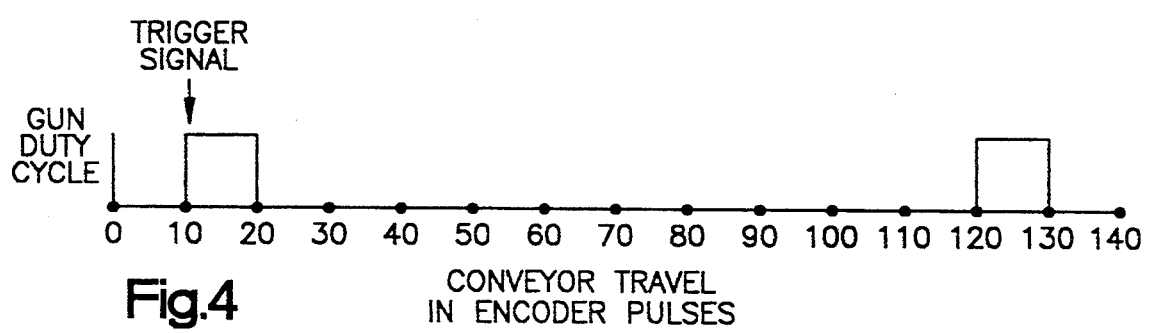
FIG. 4 shows a encoder correlated plot of spray gun actuation.

In operation, the conveyor chains 62 and 64 are set to move at a desired speed, such as for example, five feet per minute which is equivalent to one inch per second. At this speed, encoder 128 generates an encoder pulse for every 0.005 inches of conveyor movement. Typically, gun 20 is left open for 0.05 inches of conveyor movement, corresponding to ten encoder pulses. The valve is then closed for approximately 100 encoder pulses or for 0.5 inch of board movement. This pulsing pattern is shown in FIG. 4. The side edge 24A of the spray pattern 24, which is shown in FIG. 1, is typically about 1.5 inches in width. Side edge 24A is diagrammatically shown to be wider for purposes of illustration. As shown in FIGS. 3A–3C, the trigger signal from sensor 124 activates controller 26 causing a first spray pulse to coat a first section 130 of undersurface 82 corresponding to the 1.5 inch width of the spray pattern plus the 0.05 inch of board travel. Then, the spray is pulsed off for 0.5 inches of board travel which is equivalent to 100 encoder pulses. The next spray pulse is pulsed on again and coats a second section 132 for 1.5 inches plus 0.05 inches of board travel which overlaps the first section 130. Since the side edge of the spray pulse is approximately 1.5 inches in width and since the second spray pulse will be actuated 100 encoder pulses, or 0.5 inches, after the start of the first spray pulse, the first and second sections 130 and 132 will overlap by approximately 1.0 inches. Continuing, when the spray pulse is pulsed on for the third time, after another 0.5 inches of travel (i.e. after another 100 encoder pulses), there will be a third section 134 of undersurface 82, having a width of approximately 1.55 inches, which overlaps both the first and second sections 130 and 132 by approximately 0.5 inches. In this way, the entire undersurface 82 of circuit board 12 is coated by three consecutive on pulses. Each through-hole 78 will therefore be sprayed with three different pulses of coating material from three different angles, as seen in FIGS. 3A–3C, at relatively high pressures of about 400 to 600 psi, to achieve good penetration and coating of each through-hole 78. The spray pulse program of controller 128 is set up to ensure that every part of the undersurface of board 12 is hit with three on pulses in the presently preferred embodiment. While the previous example is described in terms of three overlapping coated sections, it is also within the terms of the invention to program controller 26 so that every part of the undersurface of the board sprayed with at least two pulses or four or more pulses depending on the thickness of the coating desired. Moreover, it should be noted that not only does the airless method reduce overspray, but by pulsing the airless spray, the amount of coating material sprayed onto each board is also reduced, compared to continuous airless spray, which further reduces overspray.

In the preferred embodiment, where the entire undersurface of board 12 is coated with three pulses, the first pulse is activated while front edge 70 of board 12 is positioned with respect to nozzle 22 so that only about one third of the spray pattern coats the board. The remainder of the spray is overspray and must be effectively collected. Then, during the second pulse, about two thirds of the spray pattern coats the board. Again, overspray is generated which must be collected. Finally, the third pulse is initiated when the board is positioned with respect to nozzle 22 so that the spray coats a section of the board from the leading edge 70 towards the rear edge 72. In a similar manner, when the last section adjacent rear edge 72 is being coated, the final two pulses spray coating material past the board. This pattern is necessary to ensure that the entire board is coated by three on pulses.

The controller 26, incorporated in system 10, is a Nordson Model PC44 timer, manufactured by Nordson Corporation of Westlake, Ohio, the assignee of the present invention, which is typically used for applying stitches of hot melt adhesive to the tops of boxes, for example. Controller 26 can store up to four pulsing programs so that the frequency and duration of the spray pulses can be varied for different types of circuit boards.

Another important aspect of the present invention is that overspray is reduced, which improves material utilization and transfer efficiency. This is accomplished by first, as previously mentioned, replacing the prior art misting type, air atomization spray gun, with a higher pressure, airless spray gun 20 that directs the liquid flux material more forcefully at the undersurface 82 of circuit board 12 without creating a significant cloud of overspray, and further which is pulsed to reduce the amount of coating material sprayed. Second, overspray collection means 30 includes a first overspray collection spray duct means 140 provided immediately adjacent each side edge 74 and 76 of board 12 where the greatest amount of overspray is generated. Overspray collection duct means 30 also includes a second overspray collection spray duct means 141 provided directly above board 12.

Referring to FIG. 2, overspray collection spray duct means 140 includes a fixed duct 142 with an inlet opening 144 secured at a location adjacent and slightly below the location of the edge 74 of circuit board 12 transported by conveyor chain 64 which is carried on fixed rail 63. An outlet opening 146 of duct 142 opens into the upper section of flux coating chamber 16 and exhausts through vent 36 which is connected to a fan (not shown). Overspray collection spray duct means 140 also includes an extendable duct 148 with a telescoping inlet section 150 comprising multiple duct sections 150a, 150b which can be extended or retracted so that an inlet opening 152 is located adjacent and slightly below the location of the opposite edge 76 of circuit board 12 transported by conveyor chain 62 which is carried on the adjustable rail 65. An outlet opening 154 of duct 148 opens into the upper section of flux coating chamber 16 and exhausts through opening 36. During operation, any overspray generated at the side edges of circuit board 12 is collected in ducts 142 and 148 and conveyed upwardly through a filter member, such as filter member 156, which can extend into ducts 142 and 148 as well as across the upper section of flux coating chamber 16.

A second overspray collection chamber 141 has filter member 156 disposed between the chamber 141 and the upper section of flux coating chamber 16. Exhaust vent 36 exhausts the overspray from chamber 141. The collection chamber 141 is particularly important whenever the front and rear edges 70, 72 of circuit board 12 are being sprayed since some of the spray is not directed against undersurface 82 during the spraying of the front or rear edges 70, 72.

Figure 2A:
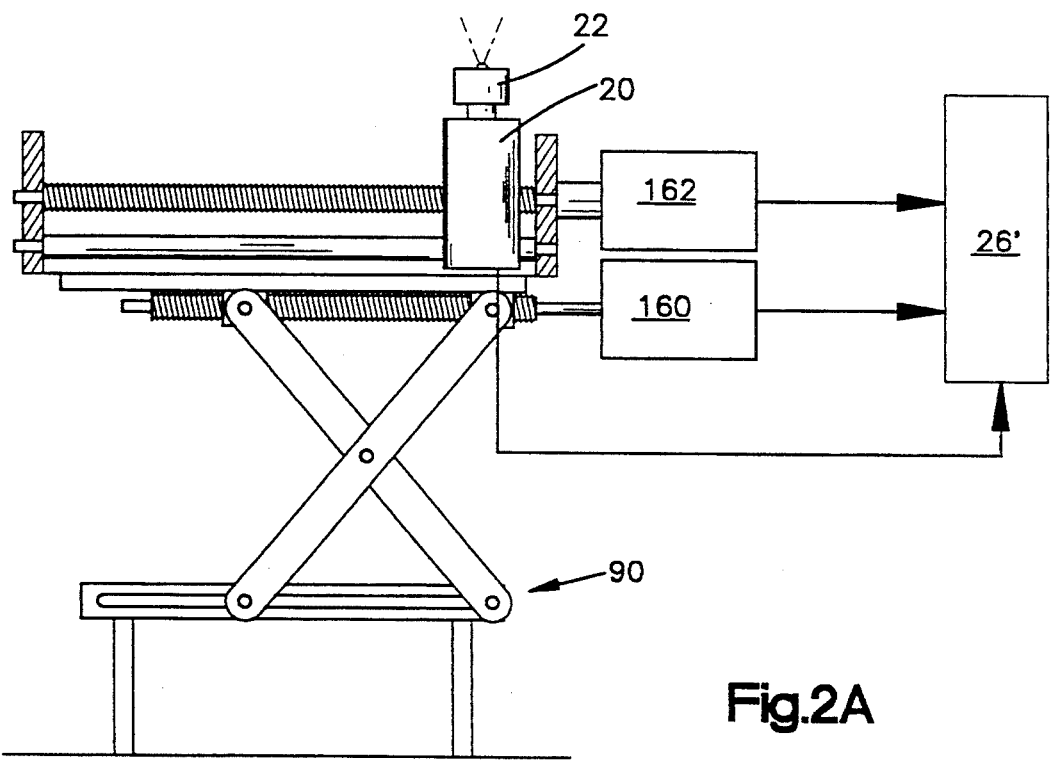
FIG. 2A is an elevational enlarged view of a spray gun adjustably mounted and automatically controlled.

While the positioning means 92 currently has hand cranks 96 and 114 to manually set the position of gun 20, it is also within the terms of the invention to substitute motors 160 and 162 connected to a controller 26' for hand cranks 96 and 114, respectively, as shown in FIG. 2A, and for an identification of the circuit board which is about to be coated to be input into controller 26'. In response to board identification information, controller 26' would access a look up table for gun position and pulse program information. Throughout the specification, primed numbers represent structural elements which are substantially identical to structural elements represented by the same unprimed number. In this way, in response to the board identification information which is input to controller 26', controller 26' could automatically set the distance of the spray nozzle 22 from the undersurface of the board in relation to the width of the board, center the gun with respect to the board, and select the appropriate pulse pattern for the board.

It is apparent that there has been provided in accordance with this invention a system and process for applying a flux coating to a circuit board that satisfy the objects, means and advantages set forth hereinbefore. According to the invention, a flux coating is applied to a circuit board by pulsing an airless spray gun on and off to achieve excellent circuit board through-hole penetration and uniform film thickness while reducing overspray to increase material utilization and substantially eliminate a messy clean up operation. An overspray collection system is provided to prevent any overspray which is generated from depositing onto the coating chamber and conveyor.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

We claim:

1. A process for applying a flux coating to a circuit board, said process comprising the steps of:
   transporting said circuit board through a coating chamber;
   disposing a stationary airless spray gun having a nozzle within said coating chamber, connecting said gun to a source of flux coating liquid to emit a liquid spray pattern from said nozzle; and
   intermittently pulsing said gun on and off to coat a section of said circuit board with said liquid spray pattern in response to said circuit board moving a predetermined distance through said coating chamber whereby adjacent coated sections partially overlap each other so that each of said sections is sprayed two or more times.

2. The process of claim 1 wherein said step of pulsing said gun on includes the step of applying said flux to the undersurface of said circuit board so as to penetrate into a plurality of through-holes between the upper surface and the undersurface of said circuit board which are adapted to receive the leads of electrical components.

3. The process of claim 1 further comprising the steps of sending count signals to a controller corresponding to the movement of a conveyor which transports said circuit board through said coating chamber;
   transmitting a signal to said controller indicating the position of said board;
   pulsing said gun on whenever said board is in a position to be coated; and
   pulsing said gun off whenever said board moves out of a position to be coated.

4. The process of applying a coating of flux to the undersurface of a printed circuit board, said process comprising the steps of:
   transporting said circuit board through a coating chamber and across a spray pattern of said flux emitted from a spray gun whereby said undersurface of said circuit board is sprayed coated with flux; and
   collecting oversprayed flux below said undersurface of said circuit board by means of ducts located at the side edges of said circuit board.

5. The process of claim 4 including the step of collecting oversprayed flux from within said coating chamber from above the uppersurface of said circuit board.

6. A method for applying a flux coating to the undersurface of a circuit board, said method comprising the steps of:
   transporting said circuit board through a coating chamber in a direction of travel;
   disposing an airless spray gun having a nozzle within said coating chamber and connecting said gun to a source of flux coating liquid whereby a liquid spray pattern is emitted from said nozzle; and
   varying the distance between said nozzle of said spray gun and the undersurface of said circuit board so that outer edges of said spray pattern strike opposite edges of said board.

7. The method of claim 6 including the step of aligning said nozzle with the center of said circuit board extending in the direction of travel.

8. The method of claim 7 including the steps of: automatically setting the distance of said nozzle from said undersurface of said board in relation to the width of the board; and automatically centering said gun with respect to said board.

* * * * *